US012812877B2

(12) United States Patent
Dory et al.

(10) Patent No.: US 12,812,877 B2
(45) Date of Patent: Nov. 24, 2026

(54) ASSEMBLY COMPRISING AT LEAST TWO NON-VOLATILE RESISTIVE MEMORIES AND A SELECTOR, ARRAY AND MANUFACTURING METHODS ASSOCIATED THEREWITH

(71) Applicants: COMMISSARIAT A L'ENERGIE ATOMIQUE ET AUX ENERGIES ALTERNATIVES, Paris (FR); WEEBIT NANO LTD, Hod Hasharon (IL)

(72) Inventors: Jean-Baptiste Dory, Grenoble Cedex (FR); Gabriel Molas, Grenoble Cedex (FR); Jean-François Nodin, Grenoble Cedex (FR); Anthonin Verdy, Grenoble Cedex (FR)

(73) Assignees: COMMISSARIAT A L'ENERGIE ATOMIQUE ET AUX ENERGIES ALTERNATIVES, Paris (FR); WEEBIT NANO LTD, Hod Hasharon (IL)

( * ) Notice: Subject to any disclaimer, the term of this patent is extended or adjusted under 35 U.S.C. 154(b) by 330 days.

(21) Appl. No.: 18/720,988

(22) PCT Filed: Dec. 22, 2022

(86) PCT No.: PCT/EP2022/087634
§ 371 (c)(1),
(2) Date: Jun. 17, 2024

(87) PCT Pub. No.: WO2023/118519
PCT Pub. Date: Jun. 29, 2023

(65) Prior Publication Data

US 2025/0107103 A1 Mar. 27, 2025

(30) Foreign Application Priority Data

Dec. 23, 2021 (FR) ...................................... 2114442

(51) Int. Cl.
*H10B 63/00* (2023.01)
*H10N 70/00* (2023.01)

(52) U.S. Cl.
CPC ............. *H10B 63/24* (2023.02); *H10B 63/80* (2023.02); *H10N 70/011* (2023.02)

(58) Field of Classification Search
CPC ....... H10B 63/24; H10B 63/80; H10N 70/011
See application file for complete search history.

(56) References Cited

U.S. PATENT DOCUMENTS 7,215,568 B2 5/2007 Liaw et al.
10,199,434 B1 2/2019 Lee et al.
(Continued)

FOREIGN PATENT DOCUMENTS

CN 112449726 A 3/2021
CN 112585758 A 3/2021
(Continued)

OTHER PUBLICATIONS

International Search Report as issued in International Patent Application No. PCT/EP2022/087634, dated Mar. 21, 2023.
(Continued)

*Primary Examiner* — Peter M Albrecht
(74) *Attorney, Agent, or Firm* — CUSHMAN PARTNERS LLC

(57) ABSTRACT

An assembly of non-volatile resistive memories associated with a selector, includes a selector layer and an upper electrode; a first memory stack including a first active layer, extending against a part of a lateral surface of the upper electrode; a second memory stack including a second active layer, extending against another part of the lateral surface of the upper electrode; the upper electrode being common to the first and the second memory stack.

13 Claims, 7 Drawing Sheets

(56) References Cited

U.S. PATENT DOCUMENTS

| | | | |
|---|---|---|---|
| 10,825,516 | B2 | 11/2020 | Luo et al. |
| 2017/0110515 | A1 | 4/2017 | Yang et al. |
| 2020/0411754 | A1 | 12/2020 | Ruiz et al. |
| 2021/0020834 | A1 | 1/2021 | Loy et al. |
| 2021/0288251 | A1 | 9/2021 | Cheng et al. |

FOREIGN PATENT DOCUMENTS

| | | | |
|---|---|---|---|
| WO | WO 2020/131179 | A2 | 6/2020 |
| WO | WO 2021/016237 | A1 | 1/2021 |

OTHER PUBLICATIONS

Park, J. W., et al., "Etch Damages of Ovonic Threshold Switch (OTS) Material by Halogen Gas Based-Inductively Coupled Plasmas," ECS Journal of Solid State Science and Technology, 8 (6), pp. 341-345, (Year: 2019).

Verdy, A., et al., "Carbon Electrode for Ge—Se—Sb Based OTS Selector for Ultra Low leakage Current and Outstanding Endurance," IEEE, (Year: 2018), 6 pages.

Verdy, A., et al., "Optimized Reading Window for Crossbar Arrays Thanks to Ge—Se—Sb-N-based OTS Selectors," IEEE, (Year: 2018), 4 pages.

Kim, T., et al., "High-performance, cost-effective 2z nm two-deck cross-point memory integrated by self-align scheme for 128 GB SCM," IEEE, (Year: 2018), 4 pages.

Hsieh, E. R., et al., "High-Density Multiple Bits-per-Cell 1T4R RRAM Array with Gradual Set/Reset and its Effectiveness for Deep Learning," IEEE, (Year: 2019), 4 pages.

Piccolboni, G., et al. "Investigation of the potentialities of Vertical Resistive RAM (VRRAM) for neuromorphic applications," 2015 IEEE International Electron Devices Meeting (IEDM), Dec. 2015, Washington, United States. pp. 17.2.1-17.2.4, 10.1109/IEDM.2015. 7409717. hal-01804658, (Year: 2015).

[Fig.1]
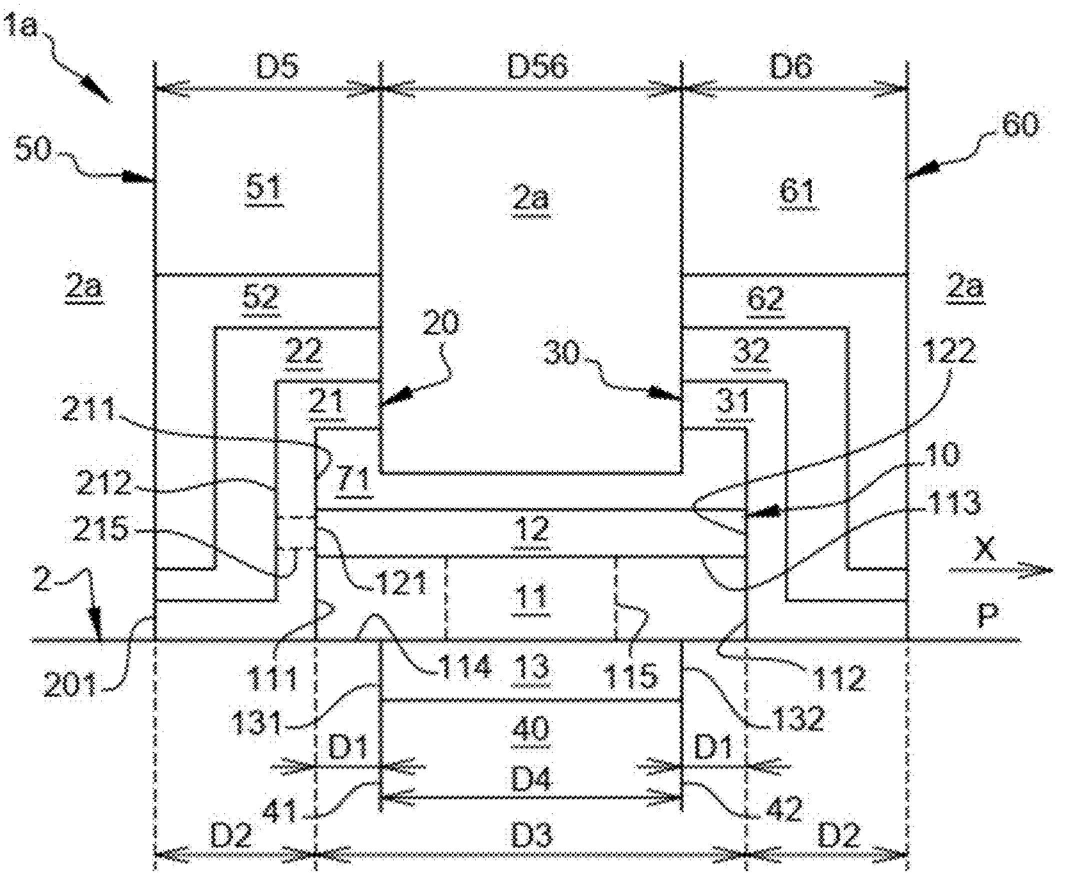

[Fig.2]
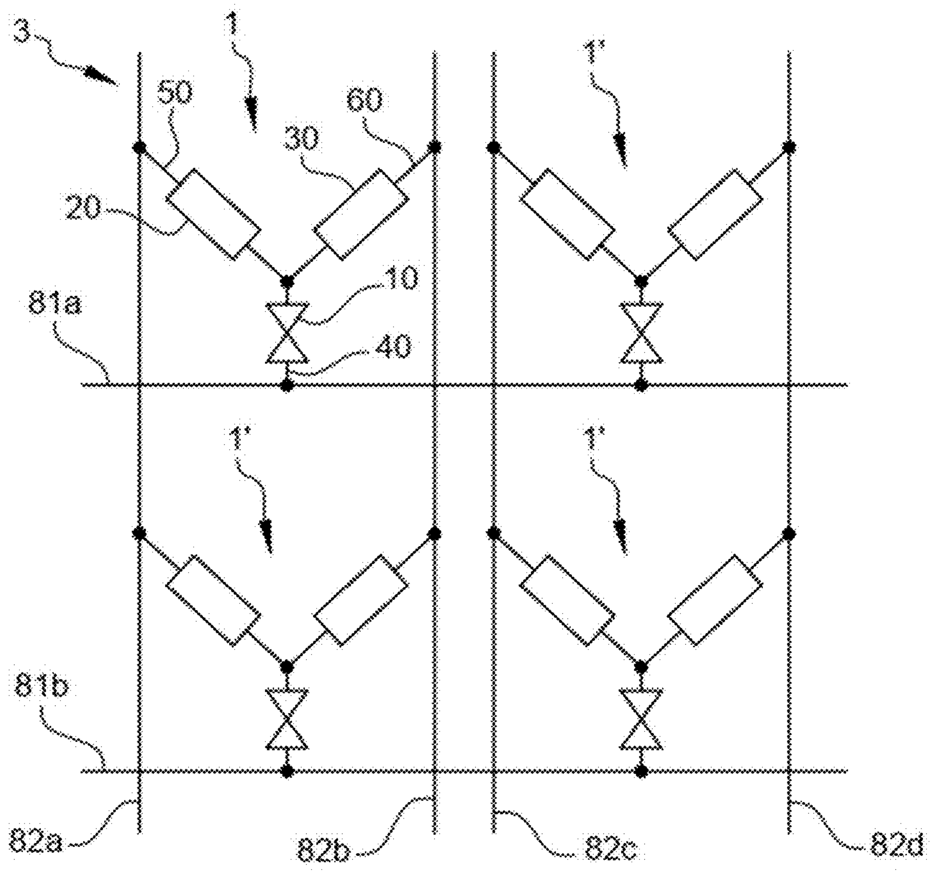
[Fig.3]
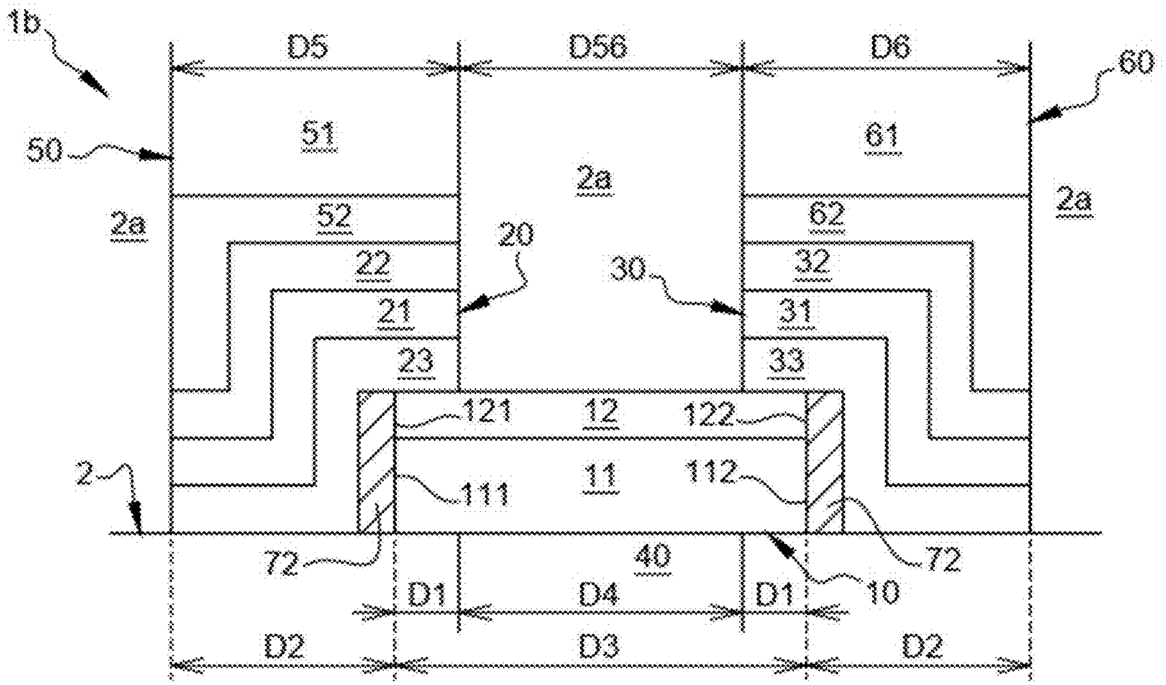

[Fig. 4]
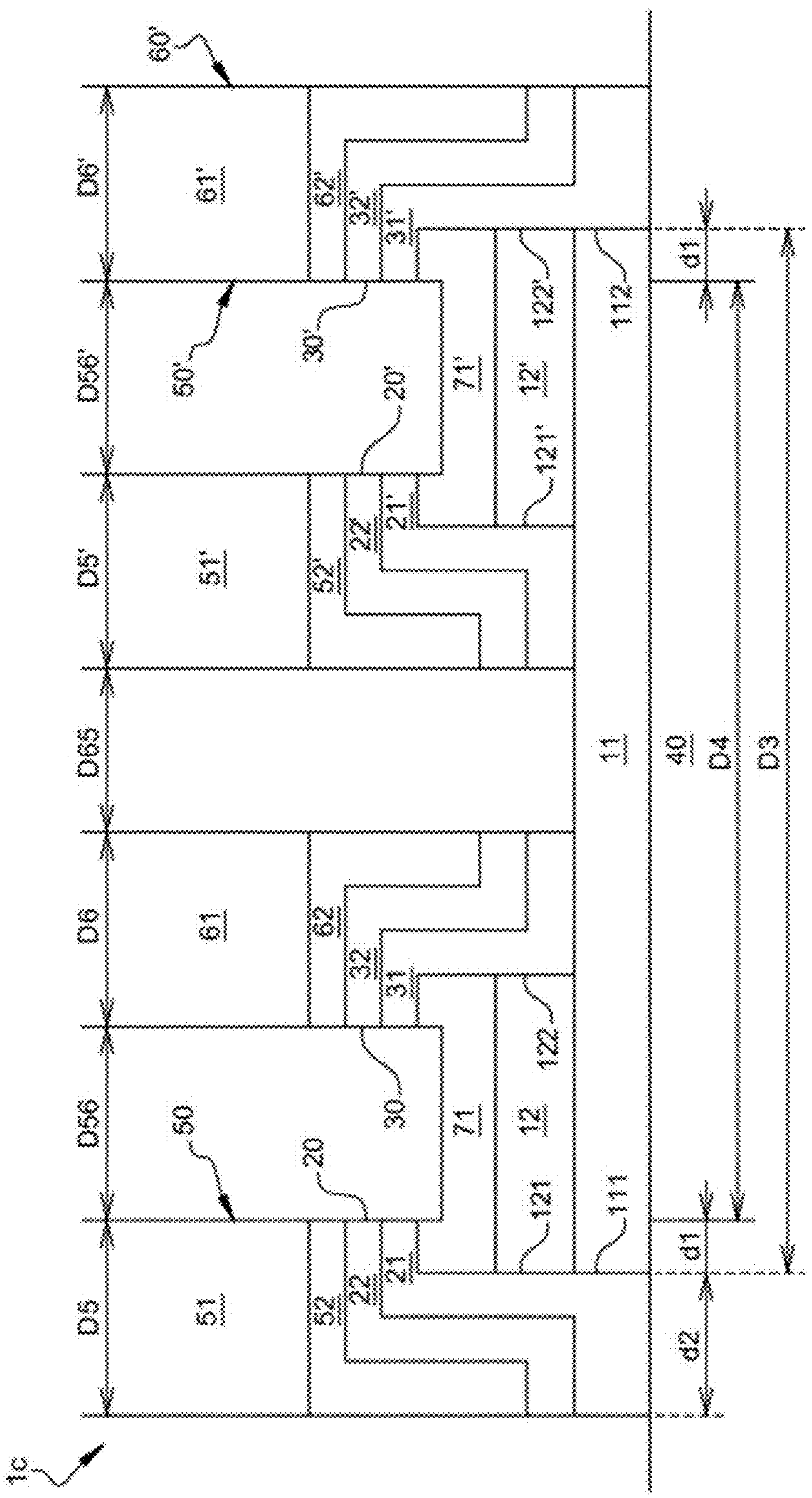

[Fig.5]
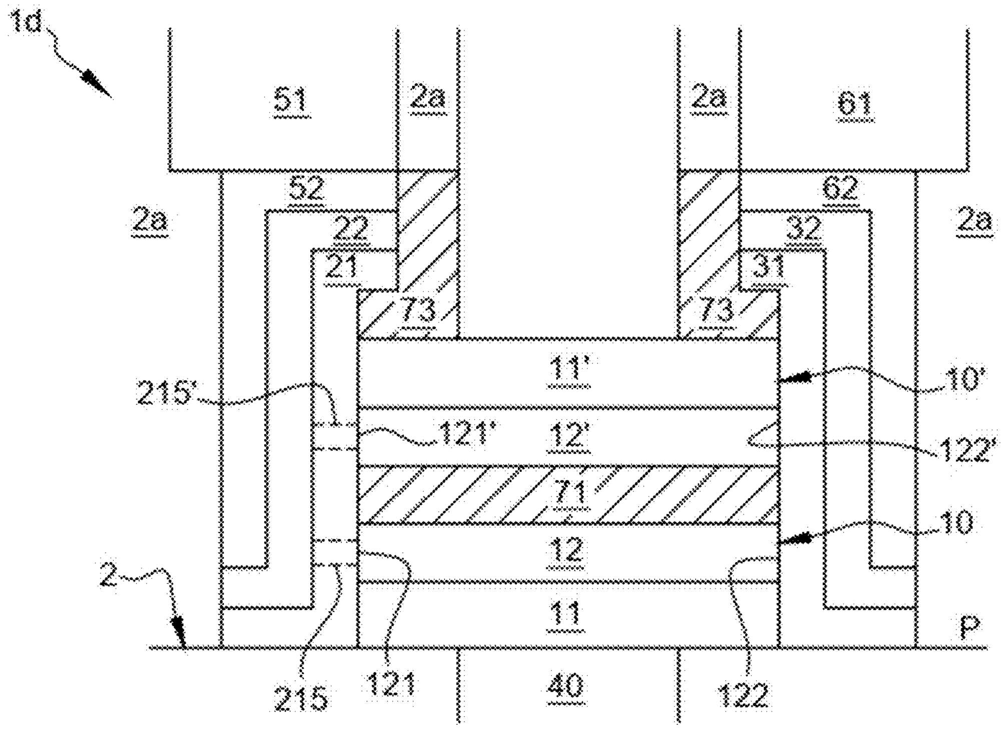
[Fig.6a]
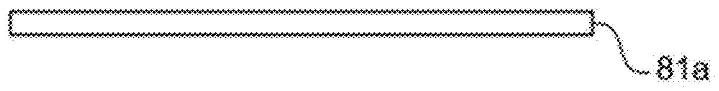
[Fig.6b]
[Fig.7a]
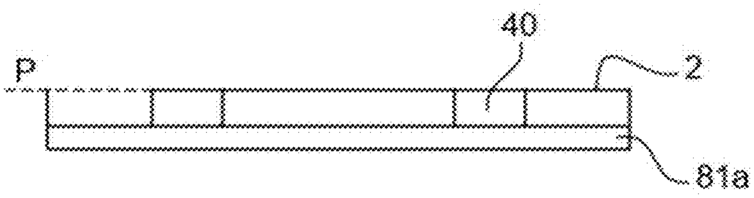

[Fig.7b]
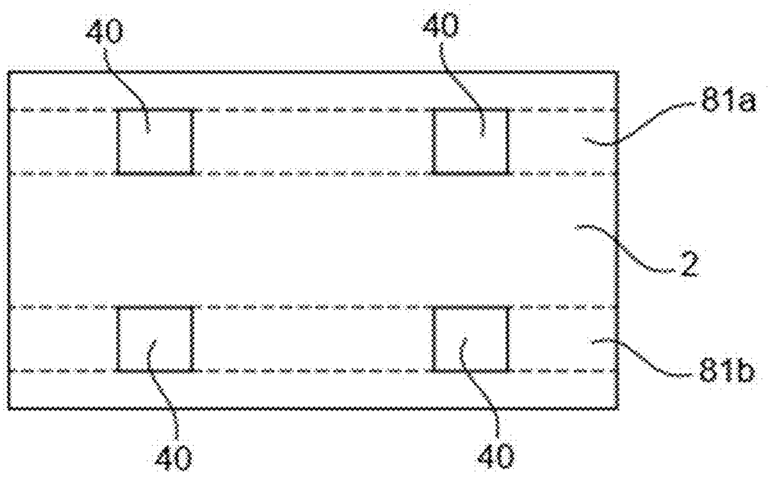
[Fig.8a]
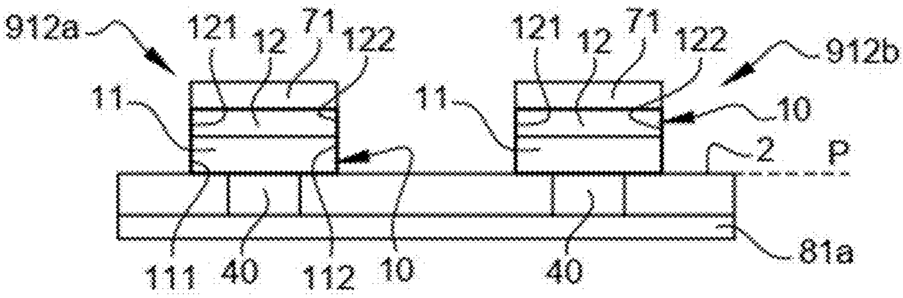
[Fig.8b]
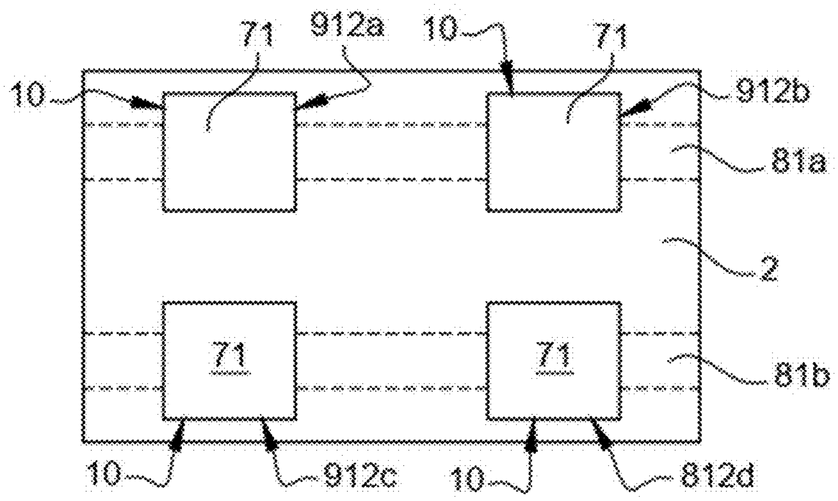

[Fig.9a]
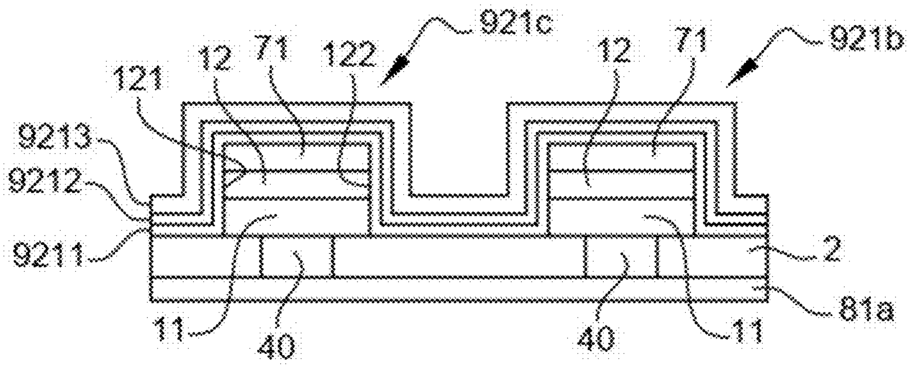
[Fig.9b]
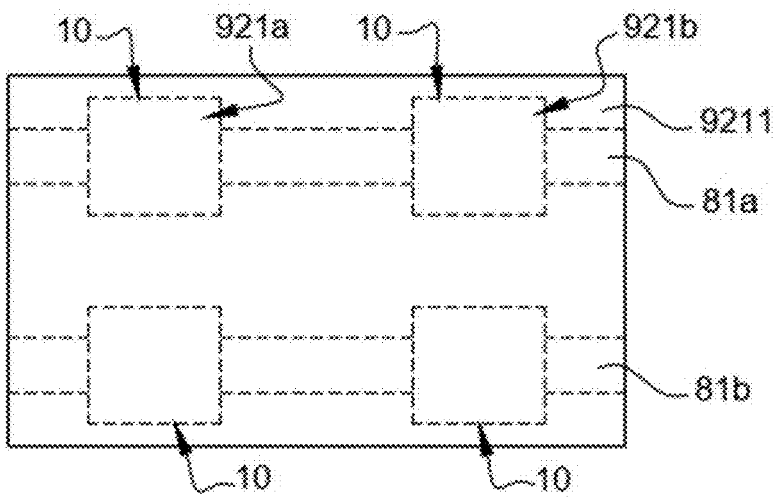
[Fig.10a]
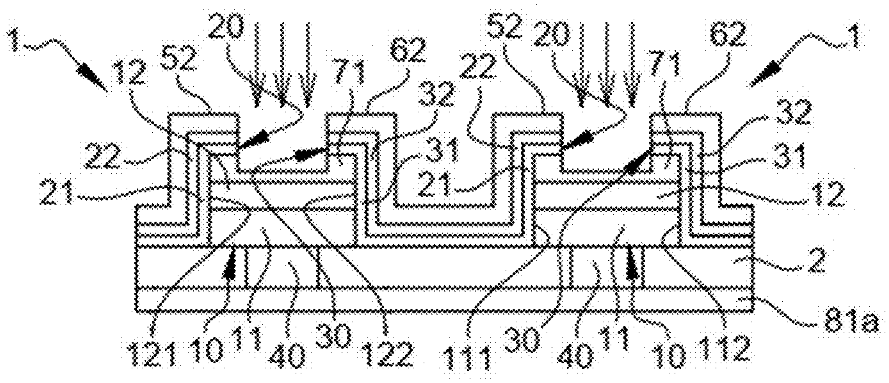

[Fig.10b]
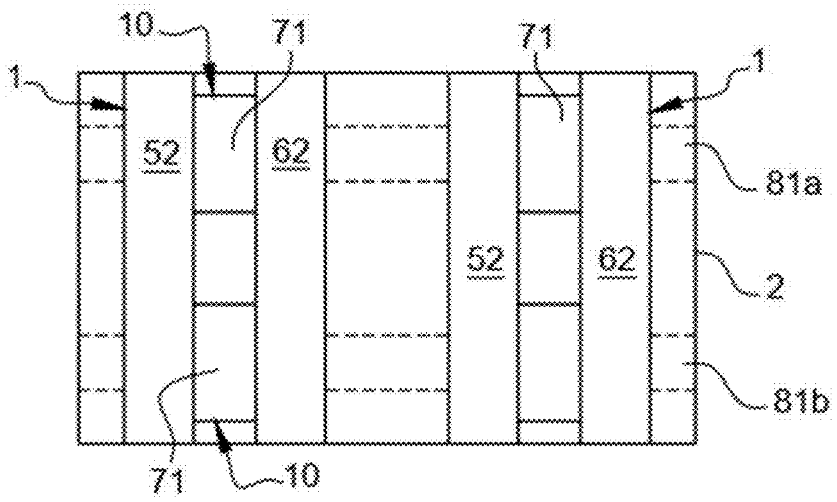
[Fig.11a]
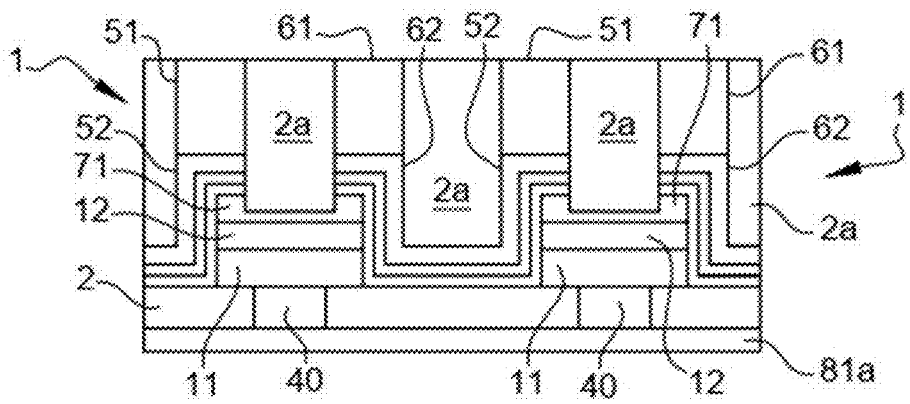
[Fig.11b]
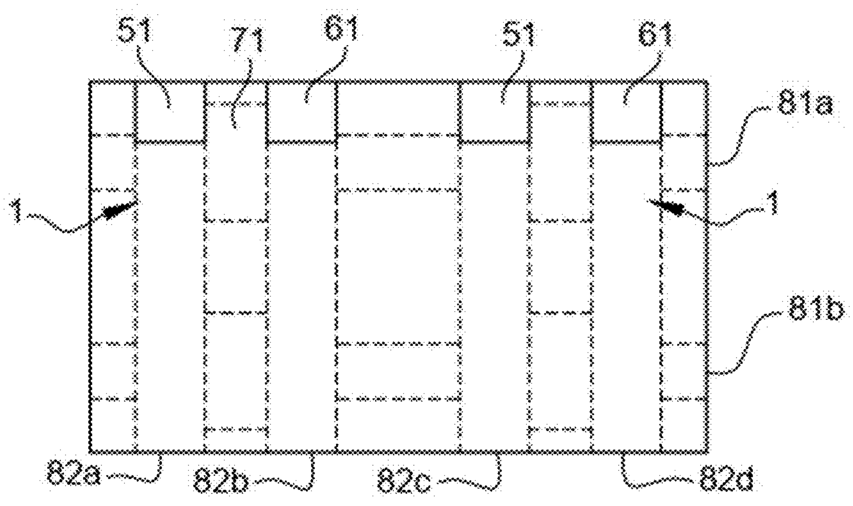

ASSEMBLY COMPRISING AT LEAST TWO NON-VOLATILE RESISTIVE MEMORIES AND A SELECTOR, ARRAY AND MANUFACTURING METHODS ASSOCIATED THEREWITH

CROSS-REFERENCE TO RELATED APPLICATIONS

This application is the U.S. National Stage of PCT/EP2022/087634, filed Dec. 22, 2022 which in turn claims priority to French patent application number 2114442 filed Dec. 23, 2021. The content of these applications are incorporated herein by reference in their entireties.

TECHNICAL FIELD OF THE INVENTION

The technical field of the invention is that of non-volatile resistive memories. It also relates to the manufacture of such memories.

TECHNOLOGICAL BACKGROUND OF THE INVENTION

The invention is part of the development of so-called "crossbar" memory arrays, in which a plurality of memory points are each located at the intersection between a conductive row and a conductive column. Each memory point is then addressed, for example by applying a voltage between the conductive row and the conductive column to which it is connected.

The invention more particularly relates to memory points comprising a resistive memory, i.e. a memory in which information is stored in the form of an electric resistance value. A resistive memory can be of different types, according to the phenomena used to write, store and read the information.

Resistive memories are typically made in layers located above a substrate (for example a Silicon substrate) on which the array is made. These components are referred to as "Back-End-Of-Line" (BEOL) components, as opposed to "Front-End-Of-Line" (FEOL) components. BEOL components, for example, are integrated between the metal interconnection levels. FEOL components are manufactured on the surface of the substrate (diodes and CMOS transistors, for example).

For example, a PCRAM (Phase Change Random Access Memory) implements the strong contrast in electronic properties between an amorphous phase and a crystalline phase of a material.

A CBRAM (Conductive Bridge RAM) implements the formation/dissolution of a conductive filament in a solid electrolyte as a result of diffusion of ions from an active electrode.

A so-called "oxide reversible dielectric breakdown" or OxRAM (Oxide RAM) memory implements reversible breakdown of a dielectric material as a function of an electrical voltage applied to this material.

A so-called magnetic memory or MRAM implements relative magnetisation between a reference magnetic layer and a programmable magnetic layer.

The use of resistive memories is proving to be a promising solution for increasing density of memory arrays. They are also being used to develop new applications such as "neuromorphic" computing and a new class of memory called "Storage Class Memory". However, resistive memories can have different drawbacks.

In an array of memory points, a plurality of resistive memories are connected to a same row or column. However, applying an addressing voltage to the terminals of one of these memories (for example to read it) creates a non-negligible leakage current in the other memories of the same row or column. This leakage current degrades the ability to read and/or write information in one of the memories.

In order to solve this problem, it is known to add selection devices, called "selectors", each connected in series with each memory ("1S1R" type arrangement). Activation of a single selector from the plurality of selectors thus enables a single memory to be selected, while the other selectors, being blocked (off), to eliminate or reduce leakage currents from the other memories.

A type of selector co-integratable in the back-end, called a "co-integratable" selector or "back-end" selector in the following, offers ease of co-integration with the memory, in series with the same, wherein its dimensions can be adjusted to the dimensions of the resistive memory. Indeed, the conducting (on) state of a back-end selector is sufficiently conductive to reduce its dimensions to the same level as those of the memory with which it can be connected in series. In addition, a back-end selector can be formed of layers deposited onto or under a memory layer and etched as a block at the same time as the memory layer. There are several types of back-end selector. There are several types of back-end selector, including the following non-exhaustive list:

- An Ovonic Threshold Switching (OTS) selector implements a characteristic property of some chalcogenide materials: under the effect of an electric field, it shifts from a resistive state to a metastable conductive state; the metastable conductive state can be maintained as long as a holding current flows in the OTS selector; otherwise, the OTS selector returns to the resistive state (off state);
- An unstable conductive bridge or TS (Threshold Switch) selector implements the formation of a metastable metal filament by diffusing, under the effect of an electric field, an active electrode in an electrolyte; when the field is no longer applied, the metastable metal filament dissolves;
- A MIEC (Mixed Ion-Electronic Conduction) selector implements mobility of metal ions for creating an electric current under the effect of an electric field;
- A metal-insulator transition selector implements a material with high electronic correlation requiring the application of an electric field exceeding a threshold field to create an electric current, the threshold field being a function of the Coulomb repulsion forcing the free electrons of said material to be located;
- A Schottky barrier or tunnel barrier selector implementing a high degree of non-linearity in its current-voltage characteristic.

A memory point comprising a "back-end" selector has a reduced overall size and is easy to manufacture (it can be etched at the same time as the resistive memory part of the memory point). However, good functionality of the assembly relies on low variability in the electrical properties of its selector and memory.

In this context, it is known to implement a selection transistor or diode instead of a back-end selector (in fact, the selection transistors or diodes enable the same function to be performed as a selector co integratable in the back-end), and to implement a "1TnR" type arrangement where n is the number of memories shared by a same transistor. Since several memories share the same "selector" (more precisely, the same transistor), the problem of variability of the individual characteristics from one selector to another is partly solved (at least at the level of the group of n memories in question). But using a transistor as a selector significantly increases the overall size of the assembly.

There is therefore a need to provide an assembly comprising at least one resistive memory associated with a 'back-end' type selector, which is of low overall size, is convenient to manufacture, and wherein the above-mentioned variability problem is at least partially solved.

SUMMARY OF THE INVENTION

The invention relates to an assembly comprising at least two non-volatile resistive memories electrically disposed in parallel with each other and each being electrically connected in series to a common selective layer, the assembly comprising:

- a selective stack, comprising:
  - a selective layer extending in parallel to a given plane;
  - an upper selector electrode extending on the selective layer, the upper electrode being laterally delimited by a side surface;
- a first memory stack, extending obliquely or perpendicularly to said plane, comprising a first active layer, at least a part of the first active layer extending against a part of the side surface of the upper selector electrode;
- a second memory stack, which extends obliquely or perpendicularly to said plane, comprising a second active layer, at least a part of the second active layer extending against another part of the side surface of the upper selector electrode;
- the first and second memory stacks being disjoint, with no direct electrical contact therebetween;
- a first electrical contact, the first active layer being electrically connected between, on the one hand, the first electrical contact and, on the other hand, the upper selector electrode;
- a second electrical contact, the second active layer being electrically connected between, on the one hand, the second electrical contact and, on the other hand, the upper selector electrode;
- the upper selector electrode being common to the first and second memory stacks, while the first and second contacts are electrically insulated from each other, with no direct electrical contact therebetween.

The first and second memory stacks, addressable independently of each other, make it possible to store information distinctly in a non-volatile manner. Each piece of information can be encoded in the form of a resistance value in the first and second active layers.

As explained in detail with reference to the figures, the oblique orientation to the plane in question, or even perpendicular to this plane, of at least a part of the first and second active layers, combined with the use of the same common, horizontal, selective layer, makes it possible to extend the selective layer while maintaining a reduced overall size, and thus leads to a reduced variability (better reproducibility/predictability) of electrical characteristics of this memory device.

The part of the first active layer, which extends against the part in question of the side surface of the upper selector electrode, may extend directly against this side surface (i.e.: without an intermediate layer), or extend against this side surface via an auxiliary layer interposed between both of them. In any case, this part of the first active layer extends opposite this part of the side surface of the upper selector electrode, for example in parallel thereto.

The same applies to the part of the second active layer, which extends against the other part of the side surface of the upper selector electrode.

Further to the characteristics just discussed in the previous paragraph, the assembly according to the invention may have one or more additional characteristics from among the following, considered individually or according to any technically possible combinations:

- the selective layer is laterally delimited by a side surface located, for example, as an extension of the side surface of the upper selector electrode;
- the selective layer is located between the upper selector electrode and a conductive lower via which is located beneath the selective layer;
- the lower via has a cross-sectional area smaller than the cross-sectional area of the selective layer and is surrounded by a dielectric material which extends beneath the selective layer;
- the lower via is laterally delimited by a side surface;
- the first memory stack is delimited by an outer side surface, which is the outermost side surface of this stack, furthest from the selective layer;
- a part of the side surface of the lower via, which is located on the same side as the first memory stack, and the outer side surface of the first memory stack are both located beneath the first electrical contact (in a projection onto the horizontal plane in question, they do not project laterally with respect to this upper contact);
- a part of the side surface of the lower via, which is located on the side of the first memory stack, and the outer side surface of the first memory stack are both located beneath the first electrical contact, in alignment therewith;
- the active layer or layers, which at least partly extend against said part or said other part of the side surface of the upper selector electrode, are in contact with this side surface, directly or through an electrically conductive layer;
- the assembly further comprises an electrically insulating spacer, which extends at least against the side surface of the selective layer, a part of the first active layer being separated from the side surface of the selective layer by this spacer;
- the spacer further extends against the side surface of the upper selector electrode, between a part of the first active layer and the side surface of the upper selector electrode;
- the first active layer comprises a portion which extends in parallel to said plane covering a part of the upper selector electrode, and which is in contact with an upper surface of the upper selector electrode;
- the assembly comprises at least one additional selective stack, located above and in line (vertically) with the selective stack, separated from the selective stack by an insulating layer;
- the additional selective stack comprises:
  - on said insulating layer, an additional selector electrode, laterally delimited by a so-called additional side surface; and
  - on the additional selector electrode, an additional selective layer;
- the first active layer further extends against a part of the additional side surface of the additional upper selector electrode; the second active layer extends against another part of the additional side surface of the additional selector electrode;

the assembly further comprises an upper via, located above the additional selective layer and electrically connected to the additional selective layer;

the upper via has a cross-sectional area smaller than the cross-sectional area of the additional selective layer and is surrounded by an additional insulating spacer which also extends on a portion of the additional selective layer.

The invention further relates to an array of non-volatile resistive memories comprising a plurality of assemblies according to the invention, wherein for each assembly:

the selective stack of the assembly under consideration is electrically connected to an addressing row of the array, the first and second electrical contacts of the assembly are electrically connected to two distinct addressing columns of the array, respectively, or form two distinct addressing columns of the array respectively.

For at least two of said assemblies neighbouring to each other, the selective layer of one of both assemblies and the selective layer of the other assembly may together form a single overall selective layer common to both assemblies, in a single piece, and wherein a same lower via, common to both assemblies, is electrically connected to a lower face of the overall selective layer.

The invention also relates to a method for manufacturing an assembly comprising at least two non-volatile resistive memories associated with a selector, comprising:

forming a selective stack comprising:

depositing a selective layer extending in parallel to a plane; and depositing an upper selector electrode extending on the selective layer, the upper electrode being laterally delimited by a side surface;

forming a first memory stack and a second memory stack comprising:

conformally depositing an overall active layer onto the selective stack, at least a first portion of the overall active layer extending against a portion of the side surface of the upper selector electrode and at least a second part of the overall active layer extending against another part of the side surface of the upper selector electrode;

separating the overall active layer into at least a first active layer and a second active layer which are disjoint, at least a part of the first active layer extending obliquely or even perpendicularly to said plane, and against the part of the side surface of the upper selector electrode; and at least a second part of the second active layer extending obliquely or even perpendicularly to said plane, and against the other part of the side surface of the upper selector electrode;

the upper selector electrode being common to the first and second memory stacks;

forming a first electrical contact and a second electrical contact, electrically insulated from each other, the first active layer being electrically connected between, on the one hand, the first electrical contact and, on the other hand, the upper selector electrode, the second active layer being electrically connected between, on the one hand, the second electrical contact and, on the other hand, the upper selector electrode.

The optional characteristics set forth above in terms of the device (for the assembly described above) may also apply to the method just set forth.

The invention and its different applications will be better understood upon reading the following description and upon examining the accompanying figures.

BRIEF DESCRIPTION OF THE FIGURES

The figures are set forth by way of indicating and in no way limiting purposes of the invention. Unless otherwise specified, a same element appearing in different figures is identified by the same reference sign.

FIG. 1 schematically represents a first embodiment of an assembly comprising at least two non-volatile resistive memories associated with a selector according to the invention.

FIG. 2 schematically represents an embodiment of an array of assemblies of this type.

FIG. 3 schematically represents a second embodiment of the assembly according to the invention.

FIG. 4 schematically represents a third embodiment of the assembly according to the invention.

FIG. 5 schematically represents a fourth embodiment of the assembly according to the invention.

FIG. 6*a* and FIG. 6*b* schematically represent, in a cross-section view and a top view, a first step in a method for manufacturing the assembly according to the invention.

FIG. 7*a* and FIG. 7*b* schematically represent, according to a cross-section view and top view, a second step of the method for manufacturing the assembly according to the invention.

FIG. 8*a* and FIG. 8*b* schematically represent, in a cross-section view and a top view, a third step of the method for manufacturing the assembly according to the invention.

FIG. 9*a* and FIG. 9*b* schematically represent, in a cross-section view and a top view, a fourth step of the method for manufacturing the assembly according to the invention.

FIG. 10*a* and FIG. 10*b* schematically represent, in a cross-section view and a top view, a fifth step of the method for manufacturing the assembly according to the invention.

FIG. 11*a* and FIG. 11*b* schematically represent, in a cross-section view and a top view, a sixth step of the method for manufacturing the assembly according to the invention.

DETAILED DESCRIPTION

The invention relates to an assembly comprising at least two non-volatile resistive memories associated with a selector, 1*a*, 1*b*, 1*c*, 1*d*. The assembly 1*a*, 1*b*, 1*c*, 1*d* according to the invention makes it possible to limit the problem of variability of electrical characteristics of the selectors mentioned above while at the same time having a reduced overall size.

For this, according to a first aspect, the assembly 1*a*, 1*b*, 1*c*, 1*d* shares a selective stack 10 (herein, a 'backend' type selective stack, which is co-integratable in series with the memory(s), in the BEOL) with at least two distinct memory stacks 20, 30, electrically disposed in parallel with each other and connected in series to the common selective stack 10. This arrangement, of the 1SnR type (with n greater than or equal to 2, n being even for example), makes it possible to limit influence of variability between selectors, since it is the same selector that is employed for several memories. From an electrical point of view, the two memory stacks 20, 30 are, as it were, disposed in parallel with each other, since, on the one hand, they are both connected to a common electrical conductor (to a common terminal, as it were), which is the upper selector electrode. However, it should be noted that, on the other side, these two memory stacks 20, 30 are connected to distinct electrical contacts (50 and 60), electrically insulated from each other.

The planar "horizontal" selective stack 10 extends in parallel to a given plane P. It comprises at least:

- a selective layer (11), which extends in parallel to the plane P; and
- an upper selector electrode 12 extending on the selective layer 11, the upper electrode being laterally delimited by a side surface 121, 122.

According to a second aspect of the invention, for each of the two memory stacks 20, 30 of the assembly 1*a*, 1*b*, 1*c*, 1*d*:

- at least a part of the first memory stack 20 of the assembly 1*a*, 1*b*, 1*c*, 1*d* extends obliquely, or even perpendicularly, to the plane P in question, and against a part of the side surface 121 of the upper selector electrode 12, and
- at least a part of the second memory stack 30 of the assembly 1*a*, 1*b*, 1*c*, 1*d* extends obliquely, or even perpendicularly, to the plane P, and against another part of the side surface 122 of the upper selector electrode 12.

This remarkable structure makes the assembly, of the 1SnR type (for example, of the 1S2R type), particularly compact.

In the following, the term planar or horizontal will designate an orientation parallel to said plane P (for example parallel to within better than 5 degrees). The plane P in question is, for example, parallel to a substrate on which the assembly 1*a*, 1*b*, 1*c*, 1*d* is made. Oblique will be intended as an orientation at an angle greater than 45° to plane P, or in other words, an orientation at an angle of 90°+45° to plane P. And vertical (or perpendicular to plane P) will be intended as an orientation at an angle of 90 degrees (for example plus or minus 5 degrees) to plane P. Herein, in the examples described here with reference to the figures, at least part of the first and second memory stacks 20, 30 extends vertically (perpendicularly to plane P). Alternatively, however, each of these two stacks could be oriented differently, extending for example in parallel to a plane making an angle of 60 degrees with said horizontal plane P (or, more generally, an angle of between 60 and 80 degrees, for example).

Here, the part of the first memory stack 20, referred to above, which extends against the part of side surface 121 of the upper selector electrode 12, extends in parallel (parallel at better than 5 or 10 degrees, for example) and opposite to that part of side surface 121.

Similarly, the part of the second memory stack 30, referred to above, which extends against the other part of the side surface 122 of the upper selector electrode 12, extends in parallel (in parallel to within better than 5 or 10 degrees, for example) to and opposite that other part of side surface 122.

In the assembly 1*a*, 1*b*, 1*c*, 1*d*, the different layers (including the electrodes) which extend in parallel to the plane P are each laterally delimited by one (or possibly more) side surface(s) which is (are) vertical or at least oblique to the plane P. The parts of this side surface are also called flank(s) in the following. In the following, for some layers, it is indicated that the layer under consideration is laterally delimited by a side surface comprising especially two parts (i.e.: by a first and second flank, here), in practice located opposite to each other. The side surface in question may nevertheless be continuous, and go all the way around the electrode without discontinuity, for example when the edge of this layer is circular (this side surface then being cylindrical); in this case, the two portions in question correspond to two portions of this continuous surface, located opposite to each other. These two parts of side surface can also correspond to two distinct faces of the perimeter of the layer in question, opposite to each other, when this perimeter is rectangular for example (rectangular seen from above the layer).

Four embodiments of the memory assembly 1*a*, 1*b*, 1*c*, 1*d* according to the invention are described, with reference to [FIG. 1], [FIG. 3], [FIG. 4] and [FIG. 5] respectively. Whatever the embodiment considered, the assembly 1*a*, 1*b*, 1*c*, 1*d* comprises a first 50 and a second 60 electrical contact, in addition to the selective stack 10. [FIG. 1] schematically represents, in a cross-section view and a side view, a first embodiment of assembly 1*a*.

In this example, the plane P corresponds to the surface of a dielectric layer 2 on which the assembly rests (it should be noted, however, that at the end of manufacture, the dielectric layer 2 may form part of an overall protective dielectric coating in which the assembly is coated).

The upper selector electrode 12 extends on the selective layer 11. The selective layer 11 is delimited by an upper surface 113 and a lower surface 114, opposite to the upper surface 113. The upper selector electrode 12 extends, for example, on and against the upper surface 113 of the selective layer 11. The lower surface 114 of the selective layer 11 at least partly rests, for example, on the dielectric layer 2, in parallel to the plane P.

The upper selector electrode 12 is laterally delimited by the side surface 121, 122 mentioned above, comprising a first part 121 and a second part 122, hereinafter referred to as first flank 121 and second flank 122. The first and second flanks 121, 122 are substantially perpendicular to the plane P. The upper selector electrode can, as here, have an overall rectangular shape. It is then laterally delimited by four parts or "flanks" (including the first and second flanks 121, 122 in question), corresponding to the four sides of this rectangle.

Selective layer 11 is also laterally delimited by a side surface 111, 112, also comprising first and second parts 111, 112, hereinafter referred to as third flank and fourth flank. The third and fourth flanks 111, 112 are opposite to each other. They can also be located as an extension of the first and second flanks 121, 122 of the upper selector electrode 12; herein, the first flank 121 (of the upper selector electrode) and the third flank 111 (of the selective layer) form a same, overall, flank of the selective stack 11 as a whole (resulting from etching of the entire selective stack); similarly, the second and fourth flanks 122, 112 then form another, overall, flank of the selective stack as a whole. Here, the selective layer 11 also has an overall rectangular shape.

In order for the selective stack 10 to perform a selection function, the selective layer 11 is configured to modify its conductivity as a function of a voltage applied between its upper and lower surfaces 113, 114, and/or as a function of an electric current flowing between these surfaces 113, 114. A threshold voltage is defined above which the selective layer 11 is in an "on" state. This means that at least a part of the selective layer 11 is then conductive. By conductive, it is meant that its resistance is less than 10 kΩ. Below the threshold voltage, the selective layer 11 is in a so-called off (blocked) state. This means that the resistance of the selective layer 11 is greater than or equal to at least 100 kΩ. The on state is preferably metastable. That is to say, the selective layer 11 is initially in the off state and has an on state only when a voltage applied between these upper and lower surfaces 113, 114 becomes greater than the threshold voltage. The selective layer 11 can maintain an on state as long as a current flowing through said layer 11 or a voltage applied to said layer 11 is greater than a given holding current/voltage (depending on the selector technology).

The selective layer 11 comprises, for example, a chalcogenide, for example an alloy based on selenium, germanium, antimony and nitrogen. In which case, the selective stack 10 is an "Ovonic Threshold Switching" selector.

The selective layer 11 can also comprise a material such that the selective stack 10 is a TS (Threshold Switch) selector, a MIEC (Mixed Ion-Electronic Conduction) selector or a metal-insulator transition selector.

The upper selector electrode 12 is conductive. It includes one or more layers parallel to the plane P. One of these layers may be metallic. Another of these layers may form a barrier to the diffusion of species into the selective layer 11, for example during method steps subsequent to the formation of said layer 11. Indeed, some steps may cause oxidation of said layer 11. By way of example, this electrode may comprise a carbon layer interposed between a titanium nitride layer and the selective layer 11.

In this first embodiment (as well as in the second and fourth embodiments), the upper selector electrode 12 extends on the entire upper surface 113 of the selective layer 11, or at least over the major part of this upper surface 113, in particular at a central portion 115 of the selective layer 11 (central portion 115 in vertical alignment with a lower via 40).

The first memory stack 20 is used to store non-volatile information. The information is encoded, for example, in the form of a resistance value of an active layer of said first memory stack 20. The first memory stack 20 may be of the PCRAM, CBRAM, OxRAM or MRAM type as described when introducing prior art. For this, the first memory stack 20 comprises at least a first active layer 21. The first active layer 21 may have a so-called "low" state, i.e. a low resistance, for example less than 10 kΩ, or a so-called "high" state, i.e. a high resistance, for example greater than 50 kΩ. The first active layer 21 shifts from the high state to the low state when a voltage applied to this layer exceeds a programming voltage, also known as the 'set' voltage. The first active layer 21 changes from the low state to the high state when a voltage or current applied to the layer exceeds a reset voltage or current (according to the technology used). The first active layer 21 comprises, for example, a hafnium oxide layer (in contact with a titanium layer acting as a tank with oxygen vacancies), in which case the first memory stack 20 performs the OxRAM function.

Similarly, the second memory stack 30 comprises at least a second active layer 31, enabling information to be encoded as a resistance value. The electrical characteristics of the first and second active layers 21, 31, including at least the programming and reset voltages, are similar or even identical.

The reduction in the overall size of assembly 1*a* results especially from sharing of the same selective stud for both memories, and from the oblique, and preferably vertical, orientation (with respect to plane P) of at least a part of the first active layer 21.

The first active layer 21 is electrically connected between the first electrical contact 50 and the upper selector electrode 12. Similarly, the second active layer 31 is electrically connected between the second electrical contact 60 and the upper selector electrode 12. Thus, the upper selector electrode 12 is common to the first and second memory stacks 20, 30. In other words, it is the same electrode 12 that electrically connects the selective layer 11, on the one hand, to the first active layer 21 and, on the other hand, to the second active layer 31. The first and second active layers 21, 31 are therefore electrically connected to each other by the same conductive, planar electrode 12. From an electrical point of view, this electrode acts as a kind of mid-point between the two memories (see the equivalent electrical diagram of FIG. 2). On the other hand, the first and second contacts 50, 60 are electrically insulated from each other.

By electrically insulated, it is meant that there is no direct electrical contact therebetween. In other words, there is no conductive, for example metal, element directly connecting them.

The assembly 1*a* may be buried in an insulating oxide filler 2*a*, which may be silicon oxide or silica.

Variability in the electrical characteristics of the selective stack 10 may be caused by steps of manufacturing said stack 10 or the memory stacks 20, 30 introducing defects in part of the selective layer 11. The defects are generally situated at the side surface of the selective layer 11 and especially at the third and fourth flanks 111, 112, exposed to etching or deposition steps. The electrical characteristics at these edges are then locally modified. It is then planned to move the third and fourth flanks 111, 112 away from each other, so that they are separated by a distance D3 greater than a width D4 of the via 40 which electrically connects the selective stack 10, in the lower part. In other words, the selective layer 11 is disposed vertically above the lower via 40 (i.e. it is superimposed, at least in part, on the lower via, in a projection along a vertical direction; or even it is aligned with this via, along a vertical direction) and it has a distance D3, for example a width, greater than the width D4 of the lower via 40. It is then at a central portion 115 of the selective layer 11 that this layer becomes conductive, when the selector switches to the on state. Stated differently, it is only at this central portion 115 that the selective layer 11 is used, from an electrical point of view. And as D3 is greater than D4, this central portion 115 is away from the flanks 111, 112 of the selective layer 11, and is therefore little or not influenced by electrical characteristics at the flanks 111, 112, possibly degraded by etching or deposition operations on the memory stacks. The central portion 115 of the selective layer 11 thus has minimal variability in its electrical characteristics.

The distance D3 separating the third and fourth flanks 111, 112 is greater than the width of the active zone (of the conduction channel) of the selector. For example, it is between 60 nm and 100 nm, or even between 70 nm and 90 nm. In an ovonic selective layer 11, the metastable conduction channel may have a planar extent that can be between 40 nm and 60 nm, and which rarely exceeds 80 nm. By thus increasing the distance D3 separating the third and fourth flanks 111, 112, variability in the electrical characteristics of the selective stack, set by those of the conduction channel located away from the flanks (away from the edges), is reduced.

The partly vertical orientation of the first and second memory stacks 20, 30 and the use of a common, planar selective layer 11 makes it possible to space apart the third and fourth flanks 111, 112 from each other, as indicated above, to reduce problems of variability, without increasing the overall size of the assembly 1*a*, with respect to devices 1R1S of prior art, at least from the point of view of overall size along the direction X represented in FIG. 1 (direction perpendicular to the first and second flanks). This aspect is explained in more detail below.

In the direction X, each memory stack 20, 30 extends, from the side surface 121, 122 of the upper electrode 12, over a second distance D2 (in the first embodiment, this distance corresponds as it were to the total thickness of the memory stack and of the optional metal layer 52 covering it). In addition, the side surfaces of the selective layer 11 and of the upper electrode 12 are both laterally offset with respect to a side surface 41, 42 of the lower via 40 by a first, non-zero, distance D1. In other words, the flanks 121 and 111 are both laterally offset with respect to a portion, referred to as the fifth flank 41, of the side surface 41, 42 of the lower via 40 by the first distance D1. Similarly, the sides 112, 122 are both laterally offset, with respect to another portion, referred to as the sixth side 42, of the side surface 41, 42 of the lower via 40, by this distance D1 (so D3=D4+2·D1). The distance D1 is preferably between 10 nm and 30 nm.

In practice, the width D4 of the lower via is limited by the etching fineness F (for example, it is equal to this fineness F, in order to reduce the dimensions of the via to a maximum), which is 40 nm for example. Similarly, the width D5 and D6 of the upper contacts 5 and 6 is limited by the fineness F, for example equal to, or substantially equal to F. These two contacts are separated by a distance D56 which is often called the "metal pitch", as it corresponds to the distance between two metal rows (or two columns) of the array (in practice, it is also the distance, along the direction X, between two adjacent assemblies 1). The "metal pitch" is limited here by the fineness F. It is, for example, equal to or substantially equal to F, in order to maximise density of the array.

Dimensioning the assembly so that the sum D1+D2 is, as here, less than or equal to the width D5 (width along direction X) of the upper contact 50 thus enables the first memory stack to be housed under this contact, as well as that part of the selective stack 10 which laterally protrudes beyond the lower via 40. Along the direction X, the overall size of the assembly is therefore 2F for each memory stack, as for a conventional device 1S1R of prior art, even though the selective layer 11 has a side extension greater than F (to limit the undesirable influence of the layer edges).

The first electrical contact 50 is disposed vertically above the first memory stack 20, extending laterally from the side surfaces 41, 42 of the lower via 40, and more particularly from the fifth side 41, to the outermost side surface 201 of the first memory stack 20 (that extending at the distance D2 from the first flank 121). The first electrical contact 50 is thus disposed vertically above the first flank 121 of the upper selector electrode 12 and each side surface of the first memory stack 20.

In a cross-section view, the first active layer 21 comprises, for example, a vertical portion and two planar portions at each of its ends. In a cross-section view, it thus forms an 'S' that can be housed under the first contact 50, in line with the same, without laterally protruding therefrom.

The two planar portions of the active layer 21 are optional. The active layer 21 could be entirely vertically oriented and disposed beneath the first contact 50.

Similarly, the second active layer 31, which is at least partly obliquely or even vertically oriented, allows the selective layer 11 and/or the upper selector electrode 12 to extend to beneath the second contact 60 without increasing the overall size of the assembly (in the direction X).

The storage density offered by an array of memory points partly depends on the spacing imposed between addressing rows two by two and/or addressing columns two by two. The smaller the spacing, the greater the storage density of the final array. This spacing, which corresponds to the distance D56 between the first and second electrical contacts 50, 60, to be connected to the addressing rows/columns, or which directly form these addressing rows/columns, is limited in practice by the fineness F of etching.

The selective stack 10 is also electrically connected to the lower via 40 mentioned above (or to another equivalent conductive element). The dielectric layer 2 on which the selective stack 10 rests has this lower via 40 passing therethrough. The lower via 40 can thus be electrically connected to the lower surface 114 of the selective layer 11, either directly, by coming into direct contact with this lower surface 114, or through one or more intermediate layers (such as the lower selector electrode 13 visible in FIG. 1). Thus, the selective layer 11 is electrically connected in series between both conductive elements, that is the upper selector electrode 12 and the conductive via 40. When a voltage greater than the threshold voltage of the selective layer 11 is applied between the upper selector electrode 12 and the lower via 40, the selective stack 10 can thus shift from the off state to the metastable, on state.

As mentioned above, the selective stack 10 here comprises the lower selector electrode 13, electrically connected in series between the selective layer 11 and the lower via 40. The lower electrode 13 extends on at least a part of the lower face 114 of the selective layer 11. When the selective layer 11 is of the OTS (ovonic) type, the lower electrode 13 advantageously comprises titanium nitride or carbon. The lower electrode 13 may also contain silver, especially when the selective layer 11 is of the TS (unstable conductive bridge) type. The lower electrode 13 is thus an active electrode and enables the selective layer 11 to change state when a positive potential is applied to the lower electrode 13. For the same reasons, the lower electrode 13 can contain copper when the lower electrode 13 is of the MIEC (mixed ion-electronic conduction) type.

Here, the conductive lower electrode 13 has the same lateral dimensions as the lower via 40 and is disposed as an extension, in line with the same. The side extension of the lower electrode 13, which is reduced relative to the side extension, D3, of the selective layer 11, makes it possible, as discussed above, to limit the zone used by the selective layer to its central portion 115. The lower electrode 13 is delimited here by a side surface 131, 132, located as an extension of the side surfaces 41, 42 of the via 40. More particularly, two portions of the side surface 131, 132 of the lower electrode 13, referred to as the seventh flank 131 and the eighth flank 132, are located as an extension of the flanks 41 and 42 of the via 40, and in any case at a distance of D1 from the flanks 111, 121, 112, 122 of the stack.

The first memory stack 20 may, as here, comprise a first upper electrode 22. The first upper electrode 22 electrically connects the first active layer 21 to the first upper contact 50. It is additionally preferably disposed between the first active layer 21 and the first upper contact 50. For this, the first upper electrode 22 extends on the first active layer 21, against the same. Advantageously, at least a part of the first upper electrode 22 also extends in parallel to the first flank 121 of the upper selector electrode 12 and opposite this first flank 121. This first upper electrode 22 may comprise one or more layers, acting for example as a tank layer for oxygen vacancies (such a layer being made of titanium, for example), or as an insulating layer opposing the passage of oxygen (titanium nitride layer, for example), or playing yet another role in the operation of the memory stack 20.

The first memory stack 20 may also comprise a lower electrode (not represented), which extends, in parallel to the first active layer 21, against the same, on a side opposite to the first upper electrode 22. Alternatively, the upper selector electrode 11 could act both as the upper selector electrode, and as the lower electrode for each of the two active layers 21, 31 of the memory stacks.

Similarly, the second memory stack 30 may comprise a second upper electrode 32 electrically connecting the second active layer 31 to the second upper contact 60, and a second lower electrode.

The first electrical contact 50 may comprise a first upper via 51 extending, for example, vertically from the first memory stack 20. In order to improve electrical contact between the first contact 50 and the first memory stack 20, the same may also comprise a first metal layer 52 electrically connecting the first memory stack 20. The first metal layer 52 partly extends, for example, on the first memory stack 20, covering a vertical part and a planar portion of said first memory stack 20. In one development, the first metal layer 52 directly acts as the first upper electrode 22. The first metal layer 52 could also form one of the addressing columns of the array, the via 51 being a connection via for this column, possibly offset from the device 1*a*.

Similarly, the second electrical contact 60 may comprise a second upper via 61 extending, for example, vertically from the first memory stack 20. It may also comprise a second metal layer 62 electrically connecting the second memory stack 30. The second metal layer 62 may also extend on the second memory stack 30, covering a vertical portion and a planar portion.

As already indicated, the first active layer 20 is electrically connected to the upper selector electrode 12. In the embodiment of [FIG. 1], the first active layer 20 is directly electrically connected to the upper selector electrode 12. More precisely, it comes into direct contact with the first flank 121 of this electrode. A first surface 211 of the first active layer is thus in contact with this flank of the upper selector electrode 12. Alternatively, however, an electrically conductive layer (such as a lower electrode of the first memory stack) could be interposed between the first active layer and this first flank 121 (this conductive layer extending against the first flank 121, while the first active layer 21 extends against this intermediate conductive layer).

Thus, the first active layer 21 has a portion disposed between the first upper electrode 22 and the upper selector electrode 12. When the first active layer 21 is, for example, of the OxRAM or CBRAM type, the application of a potential difference between the first upper electrode 22 and the upper selector electrode 12 during an initial forming operation (first creation of a conductive filament) results in the formation of a conduction channel, in the first active layer 21, at a zone in front of the first flank 121 of the upper selector electrode 12. The position of the conduction channel is therefore controlled (and, herein, is also remote from the edges—i.e. the ends—of the first active layer), making it possible to reduce variability in the first memory stack 20.

The first active layer 21 may comprise a planar portion, covering a part of the upper selector electrode 12 as it were. In order to maintain location of the conduction channel at the first flank 121 of the upper selector electrode 12, the assembly 1*a* may then comprise an insulating layer 71. This may be a layer of dielectric material, for example silicon nitride, such as a hard mask. The insulating layer is disposed at least between said planar portion of the first active layer 21 and the upper selector electrode 12. The insulating layer extends for example on the entire upper selector electrode 12, as represented by [FIG. 1].

FIG. 3 schematically represents a second embodiment of the assembly 1*b*. Unlike the embodiment of [FIG. 1], the first active layer 21 of the first memory stack 20 extends against the first flank 121 of the upper selector electrode 12 but is not directly in contact with the first flank 121.

Indeed, in this second embodiment, the assembly 1*b* further comprises an electrically insulating spacer 72, which extends against the first flank 121 of the upper selector electrode 12, and against the third flank 111 of the selective layer 11. This spacer 72 makes it possible to protect the flanks in question, especially during the operations of depositing and etching the memory stacks 20, 30. This thereby further reduces variability in the electrical characteristics of the selective stack 10. This spacer 72 is located between a part of the first active layer 21 and the first and third flanks 121, 111. It is sandwiched, as it were, between the flank of the selective stack and the vertical part of the first active layer). It extends against the flanks 111 and 121, and the vertical part of the first active layer extends against this spacer 72.

This spacer runs all the way around the selective stack 10, and therefore also extends between, on the one hand, the second and fourth flanks 122, 112, and, on the other hand, the second active layer 31.

Furthermore, in this second embodiment, the first stack 20 comprises a first lower electrode 23 electrically connecting the first active layer 21 to the upper selector electrode 12. The first lower electrode 23 extends against the first active layer 21, for example on a face of the active layer 21 opposite to the first upper electrode 22. Thus, the first active layer 21 is disposed between (as it were sandwiched between) the first upper and lower electrodes 22, 23. According to this embodiment, the first lower electrode 23 is directly connected to the upper selector electrode 12. The first upper and lower electrodes 22, 23 distribute field lines homogeneously in the active layer 21. The conduction channel can therefore be formed at a position in the active layer 21, not necessarily opposite the first flank 121 of the upper electrode 12. The first lower electrode 23 may be connected to a flank of the upper selector electrode 12 or, as here, to an upper face of the upper selector electrode 12, as set forth in [FIG. 3].

FIG. 4 schematically represents, in a cross-section view, a third embodiment of the assembly 1*c*. Unlike the embodiment of [FIG. 1], the assembly 1*c* comprises third and fourth memory stacks 20', 30', connected to a same additional upper selector electrode 12'. The first, second, third and fourth memory stacks 20, 30, 20', 30' are for example aligned in a same plane, for example that of [FIG. 4]. The third and fourth memory stacks 20', 30' can essentially have the same characteristics as the first and second memory stacks of [FIG. 1].

The additional upper selector electrode 12' is delimited by a side surface of which a first and second part 121', 122', opposite to each other, are called additional flanks 121', 122'. The additional upper selector electrode 12' is distinct from the upper selector electrode 12, without contacting the same (i.e. disjoint from the upper selector electrode 12, and therefore, especially, with no direct electrical contact with the same). The third memory stack 20' comprises a third active layer 21' which extends in parallel to the first additional flank 121' and faces it. The fourth memory stack 30' comprises a fourth active layer 31' which extends in parallel to the second additional side 122', also facing it.

The selective layer 11 is common to the two upper selector electrodes 12, 12', and extends beneath each of them. The first and fourth active layers 21, 31' of the first and fourth memory stacks 20, 30' also extend respectively opposite the third and fourth flanks 111, 112 of the selective layer 11 (over the entire height of the selective stack 10).

On the other hand, the second and third active layers 31, 21' are not opposite the flanks of the selective layer 11 (since the selective layer 11 laterally extends well beyond the second flank 122 of the upper electrode 12, and also beyond the first additional flank 121'). The selector layer 11 extends beneath the second and third memory stacks 30, 20'.

Pooling the same selective layer 11 for four memory stacks 20, 30, 20', 30' makes it possible to obtain a large distance D4 separating the third and fourth flanks 111, 112 of the selective layer 11. As the variability improves with the increase in the distance D4 separating said flanks 111, 112, the selective stack 10 has improved variability.

The lower via 40 partly extends in line with the two upper selector electrodes 12, 12' so that a conduction channel can be created beneath each of said upper selector electrodes 12, 12'. Once again, the flanks 111, 112 of the selective layer 11 are separated by the distance D3, greater than the width D4 of the lower via 40 (and even, more precisely, equal to D3+2·D1).

It will be noted that two independent conduction channels are formed in this same selective layer 11, one substantially in line with the upper electrode 12, and the other substantially in line with the additional upper electrode 12'. The assembly 1*c* is therefore in some way of the '2S4R' form.

The assembly also comprises a third electrical contact 50' and a fourth electrical contact 60'. In the same way as the first and second electrical contacts 50, 60, the third and fourth contacts 50', 60' are also electrically insulated from each other.

The third active layer 21' is electrically connected between the third contact 50' and the additional upper selector electrode 12'. The fourth active layer 22 is electrically connected between the fourth contact 60' and the additional upper selector electrode 12'.

FIG. 5] schematically represents a fourth embodiment of the assembly 1*d*. The assembly 1*d* comprises an additional selective stack 10'. The selective stack 10 and the additional selective stack 10' are oriented top-to-tail and separated from each other by an insulating layer 71.

The additional selective stack 10' comprises an additional selective layer 11' and an additional upper selector electrode 12'. The assembly 1*d* also comprises the insulating layer 71 extending between the selective stacks 10 and 10' so as to electrically insulate them from each other. The upper electrode 12 and the additional selector electrode 12' face each other, separated by the insulating layer 71. The additional selective layer 11' extends on and against the additional selector electrode 12'.

The selective stack 10 is electrically connected to a lower via 40. The selective stack 10' can also be electrically connected to a via 40', called the upper or additional selector via, located above the additional selective layer 11'. Here, the upper via 40' comes into contact with the additional selective layer 11', against it. The upper via 40' is disposed between the first and second electrical contacts 50, 60, from a lateral point of view.

The additional selector electrode 12' also has a side surface 121', 122', two parts of which, called additional flanks, are oriented obliquely or even vertically. The additional flanks 121', 122' of the additional selector electrode 12' are parallel to the first and second flanks 121, 122 of the upper electrode 12, here. Each of the additional flanks 121', 122' is preferably aligned with the first or second flanks of the upper electrode 12 respectively, located as an extension thereof. In practice, the overall stack formed by the selective stack 10, the insulating layer 71 and the additional selective stack 10' which covers it, can be laterally delimited during a same overall etching operation, producing a same overall side surface which extends on the entire height of this overall stack (and on each side or on each flank of this overall stack).

The first active layer 21 of the first memory stack 20 extends vertically over an entire part of the height of this overall stack (here, over the entire height of this overall stack, and even more). It extends not only opposite the first flank 121 of the upper selector electrode 12, but also opposite the first additional flank 121' of the additional selector electrode 12', in parallel to these flanks 121, 121'. In this way, the active layer 21 of the first memory stack can comprise two distinct conduction channels 215, 215' (one, 215, located opposite the first flank 121, and the other, 215', located opposite the first additional flank 121'), which are addressable independently of each other, each enabling a distinct piece of information to be encoded. A single active layer 21 thus makes it possible to form two distinct 'memories'.

The first active layer 21 is partly vertically oriented and thus frees up space that can be occupied by each of the selective layers 11, 11'. This reduces variability of each selective layer 11, 11'.

Like the first active layer 21, the second active layer 31 extends vertically over part of the height of the overall stack in question (here, over the entire height of this overall stack, and even more). It extends not only opposite the second flank 122 of the upper selector electrode 12, but also opposite the first additional flank 122' of the additional selector electrode 12', in parallel to these flanks 122, 122'.

The upper via 40' is insulated from each memory stack 20, 30. It is, for example, insulated by means of additional insulating spacers 73 surrounding the upper via 40'. The upper via 40' has a smaller width or cross-sectional area than the side extension, or cross-sectional area of the additional selective layer 11' (as for the lower via 40 and the selective layer 11), so as to use the additional selective layer 11' only in a central zone of this layer. The additional insulating spacer 73 then also extends on a portion of the additional electrode layer 11'.

FIG. 2 represents an equivalent electrical diagram of the assembly 1 as described with reference to [FIG. 1] and [FIG. 3]. [FIG. 2] more broadly represents an array 3 comprising several assemblies 1, 1', preferably identical, connected between two addressing rows 81*a*, 81*b* and four addressing columns 82*a*, 82*b*, 82*c*, 82*d*. The assembly 1 as described previously is especially connected between a row 81*a* and two columns 82*a*, 82*b*.

The electrical diagram of the assembly 1 comprises three branches connected to a common node (corresponding to the upper selector electrode), thus forming a Y. A first branch comprises the selective stack 10, connected in series between said common node and an addressing row 81*a*. It is for example connected to the addressing row 81*a* by means of the lower via 40. A second branch comprises the first memory stack 20. The first memory stack 20 is connected in series between said node and a first addressing column 82*a*. The addressing column is formed herein by conductive layers 22 and 52, which, at the array 3 scale, have an elongate strip shape (see FIG. 10*b*) that extends across the entire array width. The first memory stack is connected, for example, to said first addressing column 82*a* by means of the first electrical contact 50, located at the end of the column (at the end of column 82*a*). A third branch comprises the second memory stack 30. The second memory stack 30 is also connected in series between said node and a second addressing column 82*b* (formed here by the conductive layers 32 and 62, in a manner comparable to the addressing column 81*a*). The second memory stack 30 is for example connected to the second addressing column 82*b* by means of the second electrical contact 60.

The array 3 takes advantage of the embodiment of [FIG. 4]. At least two assemblies 1, 1' neighbouring to each other and connected to the same addressing row 81*a* can advantageously share one and the same selective layer 11, extending beneath each upper electrode 12 of each assembly 1, 1'. In practice, the selective layers 11 of each assembly 1, 1' together form a single overall dielectric layer, common to each assembly. Advantageously, the overall selective layer is connected to a same lower via 40, common to each assembly and electrically connected to a lower face of the overall selective layer 11.

[Table 1] below sets forth a voltage bias diagram for the addressing rows and columns 81*a-b*, 82*a-d* for carrying out the operations of programming a low state (SET), or erasing (writing a high state, or RESET) in each of the first and second memory stacks 20, 30. The value of the voltage U applied is chosen so that:

U is greater than the programming and erase voltages of each circuit 1S1R in the assembly; and U/2 is less than the threshold voltage of the selective stack 10.

The term "floating" means that the addressing row or column is left to a floating electrical potential. Between two operations, it may be advantageous to discharge the rows and/or columns left to a floating potential, by setting to a zero potential.

TABLE 1

| Operation | Stack | 81a | 81b | 82a | 82b | 82c | 82d |
|---|---|---|---|---|---|---|---|
| Programming | 20 | 0 | U/2 | U | Floating | U/2 | U/2 |
| | 30 | | | Floating | U | | |
| Erasing | 20 | U | | 0 | Floating | | |
| | 30 | | | Floating | 0 | | |

Reading the state of a memory stack can be performed using a similar, or even identical, bias scheme, but by choosing a voltage U in a read window, lower than the programming and erase voltage of each 1S1R circuit of the assembly.

The invention also relates to a method for manufacturing an assembly 1 as described previously. An implementation mode of said method is described with reference to [FIG. 6*a*] to [FIG. 11*b*].

FIG. 8*a* and [FIG. 8*b*] represent four first intermediate stacks 912*a*, 912*b*, 912*c*, 912*d*. The first four intermediate stacks can be produced simultaneously, with a view to manufacturing an array 3 of resistive memories. The description below refers to a single first intermediate stack 912*a*. It is however transposable to neighbouring first intermediate stacks 912*b*, 912*c*, 912*d*.

The first intermediate stack 912*a* comprises, for example from the surface of a dielectric layer 2, a selective stack 10 comprising a selective layer 11 and an upper selector electrode 12, extending on the selective layer 11.

To obtain said first intermediate stack 912*a*, the method for manufacturing firstly comprises forming the selective stack 10. It especially comprises forming a selective layer 11, extending in parallel to the plane P, for example on the surface of the dielectric layer 2. This involves, for example, depositing a first layer, for example based on Ge—Se—Sb—N, and delimiting said first layer so as to form the selective layer 11 (in practice, the entire selective stack is laterally delimited during a same etching step). The selective layer 11 is thus delimited by third and fourth flanks 111, 112.

Forming the selective stack 10 also comprises forming an upper selector electrode 12, extending on the selective layer 11. This means, for example, depositing a second layer, for example of TiN, onto the selective layer 11. Secondly, the second layer is delimited so as to form the upper selector electrode 12. The upper electrode is thus laterally delimited by a side surface comprising at least two parts, referred to here as the first and second flanks 121, 122.

Advantageously, the first and second layers can be deposited successively, one on top of the other. Said two layers are then delimited in a same step, so as to form the selective layer 11 and the upper selector electrode 12.

The first intermediate stack 912*a* may also comprise an insulating layer 71, extending on the upper selector electrode 12. In which case the method may also comprise a step of depositing an insulating layer onto the first and second layers so that delimiting the same also delimits the insulating layer 71.

FIG. 9*a* and [FIG. 9*b*] represent a second intermediate stack 921*a* comprising an overall active layer 9211, covering the selective stack 10 and the surface of the dielectric layer 2 not covered by the selective stacks 10. The overall active layer 9211 is intended to form the first and second active layers 21, 31 of the first and second memory stacks 20, 30.

The second intermediate stack 921*a* may also comprise a first conductive layer 9212 extending on the overall active layer 9211, intended to form the first and second upper electrodes 22, 32 of the first and second memory stacks 20, 30. It may also comprise a second conductive layer 9213, intended to form at least some of the first and second electrical contacts 50, 60. Here, the second conductive layer 9213 is intended, after etching, to form addressing columns of the array.

Forming the first and second memory stacks 20, 30 comprises firstly depositing the overall active layer 9211 onto the selective stack 10 and onto the dielectric layer 2. At least a first part of the overall active layer 9211 extends opposite the first and second flanks 121, 122 of the upper selector electrode 12. The overall active layer 9211 is conformally deposited, for example so as to have a substantially constant thickness at any point. By substantially constant, it is meant to within 20%, or even within 10%, or even within 5%. This conformal deposition is carried out, for example, by "ALD" (Atomic Layer Deposition).

The method may further comprise depositing the first conductive layer 9212, for example by conformal deposition, so that it extends on the active layer 9211. The method may also comprise depositing the second layer 9213, for example also by conformal deposition, so that it extends on the first conductive layer 9212.

FIG. 10*a* and [FIG. 10*b*] represent an assembly 1, different from the second intermediate stack 921*a* of [FIG. 9*a*] in that it comprises first and second memory stacks 20, 30, disposed on either side of the selective stack 10 and of the first and second electrical contacts 52, 62.

To obtain the first and second memory stacks 20, 30, the method comprises etching the overall active layer 9211 so as to separate it into a first active layer 21 and a second active layer 31. Etching is carried out so that at least a first part of the first active layer 21 extends opposite the first flank 121 of the upper selector electrode 12, preferably in parallel thereto, and so that at least a second part of the second active layer 31 extends against the second flank 122 of the upper selector electrode 12, preferably opposite and in parallel thereto.

Etching can be stopped before reaching the upper selector electrode 12, so as not to degrade it. In any case, it is stopped before reaching the selective layer 11, so that the upper selector electrode remains in one piece over the entire selective layer 11.

The etching step may also simultaneously etch the first conductive layer 9212 in two parts so that they respectively form the first and second upper electrodes 22, 32, extending for example respectively on the first and second active layers 21, 31.

The method may also comprise depositing an insulating layer 71 on the upper selector electrode 12, prior to depositing the overall active layer 9211. Etching 922 may then stop on the insulating layer 71 or stop in said layer 71, creating a trench for example.

Forming the electrical contacts 52, 62 is, for example, performed at the same time as the step of etching the first conductive layer 9212. It thus enables the electrical contacts 52, 62 to be electrically separated from one another.

The etching step may also make it possible to electrically separate the neighbouring second intermediate stacks 921*a*, 921*b* by separating the layers 9211, 9212, 9213 deposited onto each selective stack 10.

The method may comprise, prior to forming each selective stack 10, forming at least one addressing row 81*a*, 81*b* as represented by [FIG. 6*a*] and [FIG. 6*b*].

The method may also comprise, prior to forming each selective stack 10, forming at least one lower via 40 on each addressing row 81*a*, 81*b*, as represented by FIG. 7*a* and [FIG. 7*b*].

Each addressing row 81*a*, 81*b* and each lower via 40 can be made by using a damascene method. This means, for example, depositing a dielectric material, etching cavities for forming the addressing rows 81*a*, 81*b* or the lower vias 40 and filling said cavities with a liner, for example of titanium, and a conductive material, for example tungsten, followed by chemical mechanical polishing (or CMP).

The addressing rows 81*a*, 81*b* are buried in the dielectric layer 2. Each lower via 40 passes through the dielectric layer 2. Said dielectric layer 2 and each lower via 40 are levelled, for example by planarisation.

FIG. 11*a* and [FIG. 11*b*] represent assemblies 1 forming an array 3 of resistive memories. Each of the first and second memory stacks 20, 30 of the assemblies 1 are connected to distinct addressing columns 82*a*, 82*b*, 82*c*, 82*d*. In order to connect each memory stack 20, 30, the method 9 may comprise forming addressing columns 82*a-d*. For this, the assemblies 1 are buried under a complementary layer of dielectric 2*a*. The complementary dielectric layer 2*a* is levelled with each electrical contact 50, 60 by planarisation.

The invention claimed is:

1. An assembly comprising at least two non-volatile resistive memories electrically disposed in parallel with each other and each being electrically connected in series to a common selective layer, the assembly comprising:

- a selective stack, comprising:
  - a selective layer which extends in parallel to a given plane;
- an upper selector electrode extending on the selective layer, the upper electrode being laterally delimited by a side surface;
- a first memory stack, which extends obliquely or perpendicularly to said plane, comprising a first active layer, at least a part of the first active layer extending against a part of the side surface of the upper selector electrode;
- a second memory stack, which extends obliquely or perpendicularly to said plane, comprising a second active layer, at least a part of the second active layer extending against another part of the side surface of the upper selector electrode;
- the first and second memory stacks being disjoint, with no direct electrical contact therebetween;
- a first electrical contact, the first active layer being electrically connected between, on the one hand, the first electrical contact and, on the other hand, the upper selector electrode;
- a second electrical contact, the second active layer being electrically connected between, on the one hand, the second electrical contact and, on the other hand, the upper selector electrode;
- the upper selector electrode being common to the first and second memory stacks, while the first and second contacts are electrically insulated from each other, with no direct electrical contact therebetween.

2. The assembly according to claim 1, wherein the selective layer is laterally delimited by a side surface located as an extension of the side surface of the upper selector electrode.

3. The assembly according to claim 1, wherein:

- the selective layer is located between the upper selector electrode and a conductive lower via which is located beneath the selective layer;
- the lower via having a cross-sectional area smaller than the cross-sectional area of the selective layer and being surrounded by a dielectric material which extends beneath the selective layer.

4. The assembly according to the preceding claim 3, wherein:

- the lower via is laterally delimited by a side surface,
- the first memory stack is delimited by an outer side surface, which is the outermost side surface of this stack, furthest from the selective layer, and wherein
- a part of the side surface of the lower via, which is located on the side of the first memory stack, and the outer side surface of the first memory stack are both located beneath the first electrical contact.

5. The assembly according to claim 1, wherein the active layer or layers, which at least partly extend against said part or said other part of the side surface of the upper selector electrode, are in contact with the side surface, directly, or through an electrically conductive layer.

6. The assembly according to claim 2, further comprising an electrically insulating spacer, which extends at least against the side surface of the selective layer, a part of the first active layer being separated from the side surface of the selective layer by this spacer.

7. The assembly according to claim 6, wherein:

- the spacer further extends against the side surface of the upper selector electrode, between a part of the first active layer and the side surface of the upper selector electrode;
- the first active layer comprises a portion which extends in parallel to said plane covering a part of the upper selector electrode, and which is in contact with an upper surface of the upper selector electrode.

8. The assembly according to claim 1, comprising at least one additional selective stack, located above and in line with the selective stack, separated from the selective stack by an insulating layer.

9. The assembly according to claim 8, wherein the additional selective stack comprises:

- on said insulating layer, an additional selector electrode, laterally delimited by a so-called additional side surface; and on the additional selector electrode, an additional selective layer, the first active layer further extends against a part of the additional side surface of the additional upper selector electrode; the second active layer extends against another part of the additional side surface of the additional selector electrode, the assembly further comprises an upper via, located above the additional selective layer and electrically connected to the additional selective layer.

10. The assembly according to claim 9, wherein the upper via has a cross-sectional area smaller than the cross-sectional area of the additional selective layer and is surrounded by an additional insulating spacer which also extends on a portion of the additional selective layer.

11. An array of non-volatile resistive memories comprising a plurality of assemblies according to claim 1, wherein, for each assembly:

the selective stack of the assembly under consideration is electrically connected to an addressing row of the array, the first and second electrical contacts of the assembly are electrically connected to two distinct addressing columns of the array respectively, or form two distinct addressing columns of the array respectively.

12. The array according to claim 11, wherein, for at least two of said assemblies neighbouring to one another, the selective layer of one of both assemblies and the selective layer of the other assembly together form a single overall selective layer common to both assemblies, in a single piece, and wherein a single lower via, common to both assemblies, is electrically connected to a lower face of the overall selective layer.

13. A method for manufacturing an assembly comprising at least two non-volatile resistive memories associated with a selector, comprising:

forming a selective stack comprising:

depositing a selective layer extending in parallel to a plane; and depositing an upper selector electrode extending on the selective layer, the upper electrode being laterally delimited by a side surface;

forming a first memory stack and a second memory stack comprising:

conformally depositing an overall active layer on the selective stack, at least a first part of the overall active layer extending against a part of the side surface of the upper selector electrode and at least a second part of the overall active layer extending against another part of the side surface of the upper selector electrode;

separating the overall active layer into at least a first active layer and a second active layer which are disjoint, at least a part of the first active layer extending obliquely, or even perpendicularly to said plane, and against a part of the side surface of the upper selector electrode; and at least a second part of the second active layer extending obliquely or even perpendicularly to said plane and against the other part of the side surface of the upper selector electrode;

the upper selector electrode being common to the first and second memory stacks, forming a first electrical contact and a second electrical contact, electrically insulated from each other, the first active layer being electrically connected between, on the one hand, the first electrical contact and, on the other hand, the upper selector electrode, the second active layer being electrically connected between, on the one hand, the second electrical contact and, on the other hand, the upper selector electrode.

* * * * *